(12) United States Patent
Kim

(10) Patent No.: US 11,133,287 B2
(45) Date of Patent: Sep. 28, 2021

(54) SEMICONDUCTOR PACKAGE INCLUDING STACKED SEMICONDUCTOR CHIPS AND METHOD FOR FABRICATING THE SAME

(71) Applicant: SK hynix Inc., Icheon-si (KR)

(72) Inventor: Jae-Min Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/784,517

(22) Filed: Feb. 7, 2020

(65) Prior Publication Data

US 2021/0057379 A1  Feb. 25, 2021

(30) Foreign Application Priority Data

Aug. 20, 2019 (KR) ........................ 10-2019-0101681

(51) Int. Cl.
*H01L 25/065* (2006.01)
*H01L 23/00* (2006.01)
(Continued)

(52) U.S. Cl.
CPC ...... *H01L 25/0652* (2013.01); *H01L 21/4857* (2013.01); *H01L 21/565* (2013.01);
(Continued)

(58) Field of Classification Search
CPC ....... H01L 2225/06562; H01L 25/0657; H01L 23/3135
See application file for complete search history.

(56) References Cited

U.S. PATENT DOCUMENTS 7,633,144 B1   12/2009 Kim et al.
9,716,080 B1 *  7/2017 Chuang .................. H01L 24/19
(Continued)

FOREIGN PATENT DOCUMENTS

KR    1020100002868 A    1/2010

*Primary Examiner* — Yu-Hsi D Sun
(74) *Attorney, Agent, or Firm* — William Park & Associates Ltd.

(57) ABSTRACT

A semiconductor package may include: a chip stack including first to $N^{th}$ semiconductor chips having first to $N^{th}$ chip pads formed in active surfaces thereof, respectively, and sequentially stacked in a vertical direction such that the first to $N^{th}$ chip pads are exposed, wherein N is a natural number equal to or more than 2; first to $N^{th}$ vertical wires having first ends connected to the first to $N^{th}$ chip pads, respectively, and extended in the vertical direction; a coating layer surrounding portions of the first to $k^{th}$ vertical wires, extended from the first ends, among the first to $N^{th}$ vertical wires, and connection portions between the first ends of the first to $k^{th}$ vertical wires and the first to $k^{th}$ chip pads; and a molding layer covering the chip stack, surrounding the vertical wires, and covering the coating layer.

20 Claims, 13 Drawing Sheets

(51) Int. Cl.
*H01L 23/31* (2006.01)
*H01L 23/538* (2006.01)
*H01L 25/00* (2006.01)
*H01L 21/56* (2006.01)
*H01L 21/48* (2006.01)
*H01L 21/683* (2006.01)

(52) U.S. Cl.
CPC ........ *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 24/05* (2013.01); *H01L 24/43* (2013.01); *H01L 24/48* (2013.01); *H01L 25/0657* (2013.01); *H01L 25/50* (2013.01); *H01L 24/32* (2013.01); *H01L 24/33* (2013.01); *H01L 24/73* (2013.01); *H01L 2221/68359* (2013.01); *H01L 2224/04042* (2013.01); *H01L 2224/32145* (2013.01); *H01L 2224/33181* (2013.01); *H01L 2224/43001* (2013.01); *H01L 2224/4805* (2013.01); *H01L 2224/48227* (2013.01); *H01L 2224/73215* (2013.01); *H01L 2224/73265* (2013.01); *H01L 2225/0651* (2013.01); *H01L 2225/06562* (2013.01); *H01L 2225/06586* (2013.01); *H01L 2924/1434* (2013.01)

(56) References Cited

U.S. PATENT DOCUMENTS

| | | | |
|---|---|---|---|
| 10,128,211 | B2 | 11/2018 | Chang et al. |
| 10,276,545 | B1* | 4/2019 | Huang .................... H01L 24/85 |
| 2015/0061157 | A1* | 3/2015 | Yu ............................ H01L 25/50 257/777 |
| 2016/0035698 | A1* | 2/2016 | Lee .......................... H01L 24/83 257/777 |
| 2017/0110439 | A1* | 4/2017 | Yuan ........................ H01L 24/45 |
| 2020/0227386 | A1* | 7/2020 | Kim ..................... H01L 25/0657 |

* cited by examiner

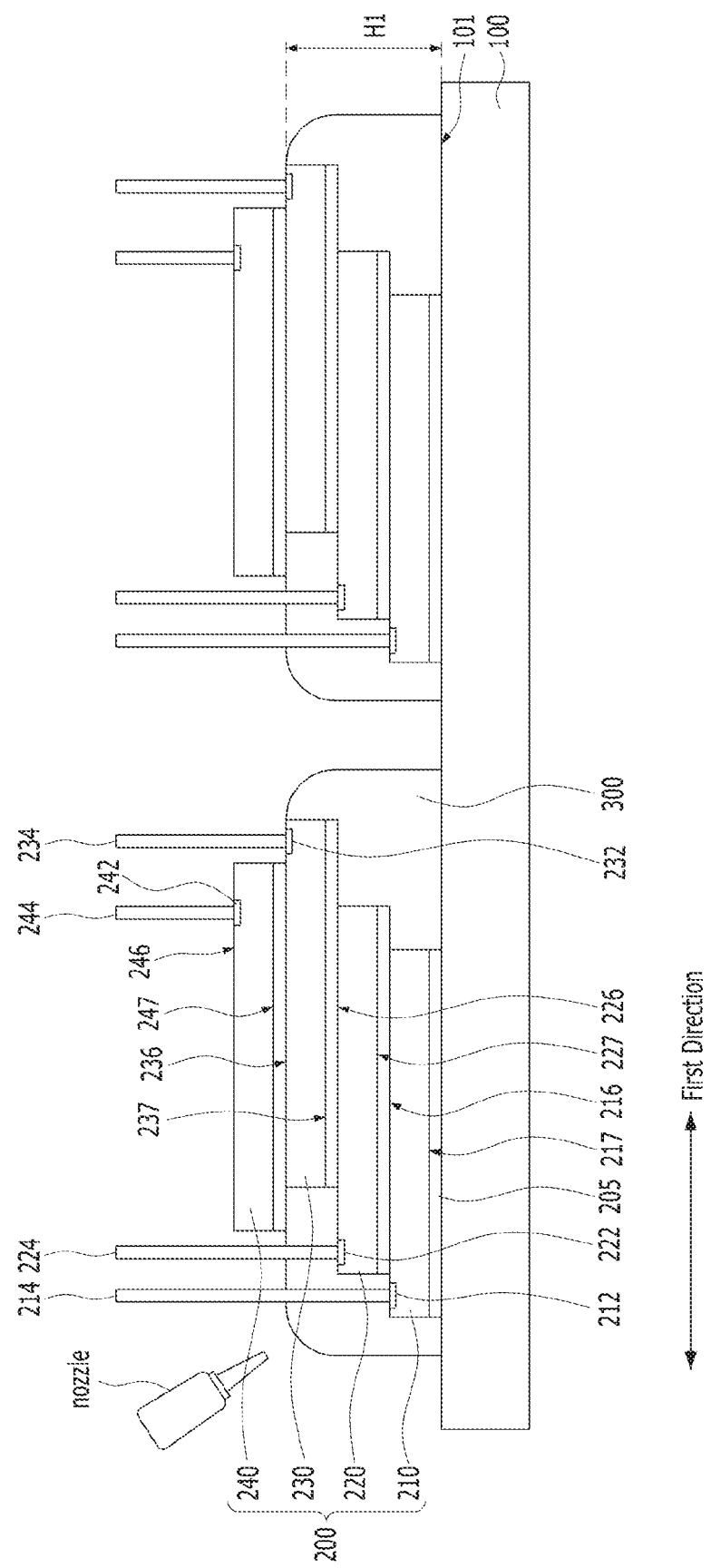

SEMICONDUCTOR PACKAGE INCLUDING STACKED SEMICONDUCTOR CHIPS AND METHOD FOR FABRICATING THE SAME

CROSS-REFERENCE TO RELATED APPLICATION

This application claims priority under 35 U.S.C. § 119 to Korean Patent Application No. 10-2019-0101681 filed on Aug. 20, 2019, which is incorporated herein by reference in its entirety.

BACKGROUND

1. Technical Field

Embodiments of the present disclosure generally relate to a semiconductor package, and more particularly, to a semiconductor package including a plurality of chips stacked over a substrate.

2. Related Art

Electronic products are required to process a large amount of data, while having a smaller volume. Thus, the need to increase the degree of integration of a semiconductor device used in such electronic products is increasing more and more.

However, due to a limitation of the semiconductor integration technology, a required capacity cannot be satisfied by only a single semiconductor chip. Thus, a semiconductor package having a plurality of semiconductor chips embedded therein is fabricated.

Although the semiconductor package includes the plurality of semiconductor chips, various requirements such as an improvement in accuracy and speed of operation, a minimized size, process simplification and cost reduction need to be satisfied.

SUMMARY

In an embodiment, a semiconductor package may include: a chip stack including first to $N^{th}$ semiconductor chips having first to $N^{th}$ chip pads, respectively, the first to $N^{th}$ chip pads formed in active surfaces of the first to $N^{th}$ semiconductor chips, respectively, and the first to $N^{th}$ semiconductor chips sequentially stacked in a vertical direction such that the first to $N^{th}$ chip pads are exposed, wherein N is a natural number equal to or more than 2; first to $N^{th}$ vertical wires having first ends connected to the first to $N^{th}$ chip pads, respectively, and extended in the vertical direction; a coating layer surrounding portions of the first to $k^{th}$ vertical wires, extended from the first ends, among the first to $N^{th}$ vertical wires, and connection portions between the first ends of the first to $k^{th}$ vertical wires and the first to $k^{th}$ chip pads, wherein k is a natural number equal to or more than 1 and equal to or less than (N−1); and a molding layer covering the chip stack, surrounding the vertical wires, and covering the coating layer.

In an embodiment, a method for fabricating a semiconductor package may include: forming a chip stack which includes first to $N^{th}$ semiconductor chips having first to $N^{th}$ chip pads, respectively, the first to $N^{th}$ chip pads formed on active surfaces of the first to $N^{th}$ semiconductor chips, respectively, and the first to $N^{th}$ semiconductor chips sequentially stacked in a vertical direction such that the first to $N^{th}$ chip pads are exposed, wherein N is a natural number equal to or more than 2; forming first to $N^{th}$ vertical wires having first ends connected to the first to $N^{th}$ chip pads, respectively, and extended in the vertical direction; forming a coating layer which surrounds portions of the first to $k^{th}$ vertical wires, extended from the first ends, among the first to $N^{th}$ vertical wires, and connection portions between the first ends of the first to $k^{th}$ vertical wires and the first to $k^{th}$ chip pads, wherein k is a natural number equal to or more than 1 and equal to or less than (N−1); and forming a molding layer which covers the chip stack, surrounds the vertical wires, and covers the coating layer.

BRIEF DESCRIPTION OF THE DRAWINGS

FIGS. 1A, 1B, 2A, 2B, 3A, 3B, 4, 5, and 6 are diagrams for describing a semiconductor package and a method for fabricating the same in accordance with an embodiment.

DETAILED DESCRIPTION

Figure 1A:
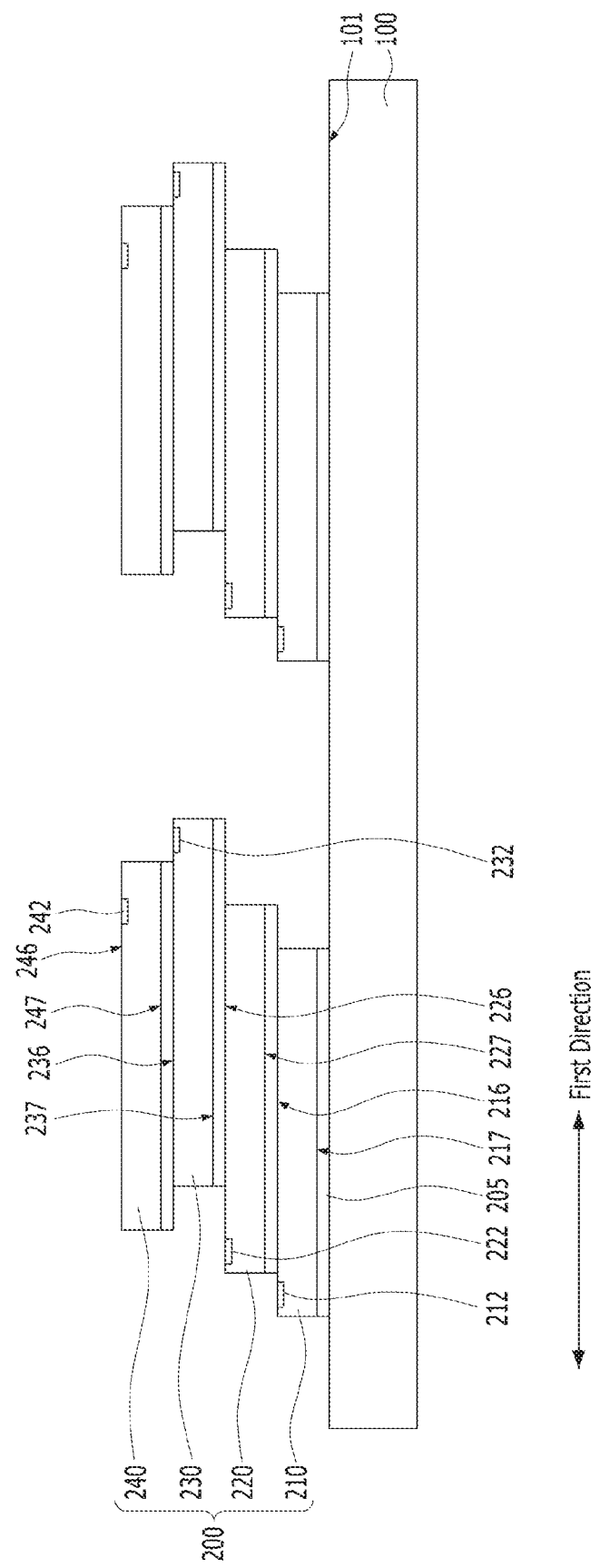

Various examples and implementations of the disclosed technology are described below with reference to the accompanying drawings.

The drawings might not be necessarily to scale and in some instances, proportions of at least some of structures in the drawings may have been exaggerated in order to clearly illustrate certain features of the described examples or implementations. In presenting an example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As an example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments may be directed to a semiconductor package including stacked semiconductor chips, which can suppress a defect during a fabrication process, and a method for fabricating the same.

FIGS. 1A to 6 are diagrams for describing a semiconductor package and a method for fabricating the same in accordance with an embodiment. FIGS. 1A, 2A, 3A, 4, 5 and 6 are cross-sectional views, and FIGS. 1B, 2B and 3B are plan views corresponding to FIGS. 1A, 2A and 3A, respectively. FIGS. 1B, 2B and 3B illustrate one chip stack, and FIGS. 1A, 2A and 3A are cross-sectional views taken along X-X' lines of FIGS. 1B, 2B and 3B, respectively, illustrating two chip stacks.

First, a fabrication method will be described.

Figure 1B:
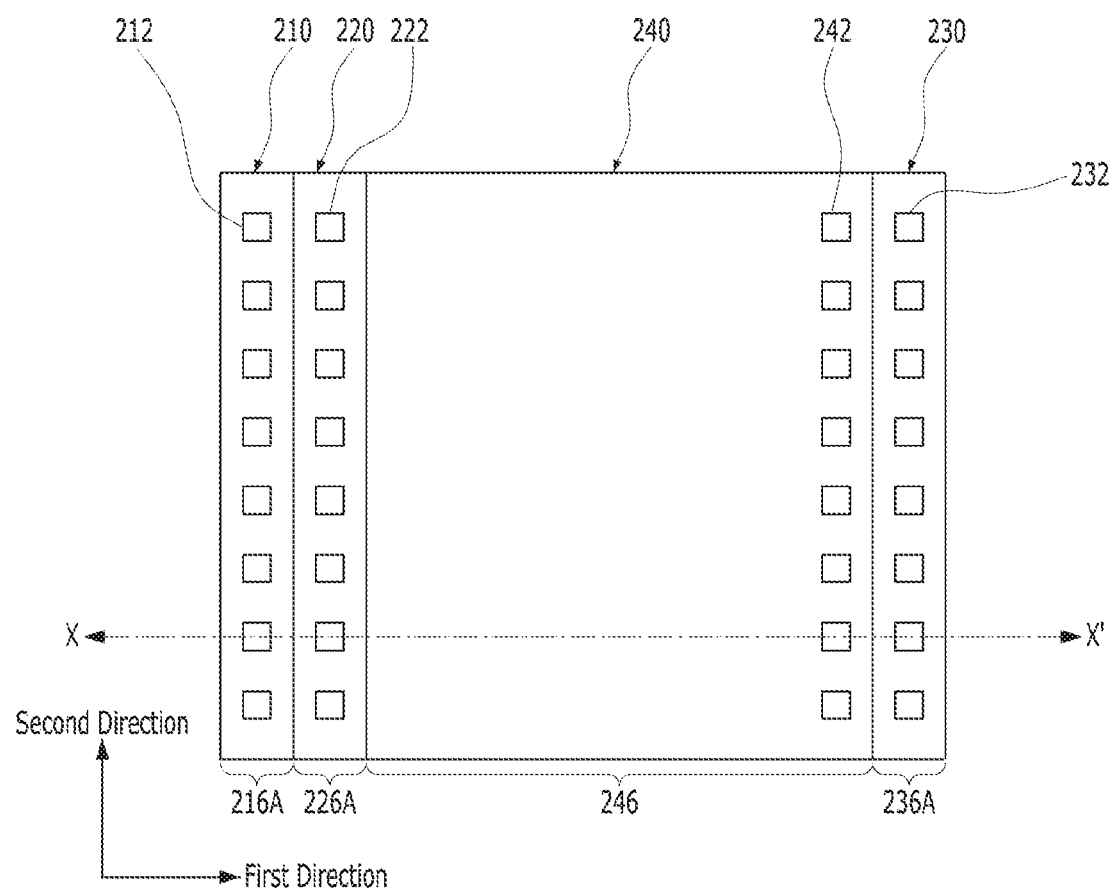

Referring to FIGS. 1A and 1B, a carrier substrate 100 may be provided. The carrier substrate 100 may be a glass carrier substrate, a ceramic carrier substrate or the like. Alternatively, the carrier substrate 100 may be a wafer, and a plurality of packages may be simultaneously formed on the carrier substrate 100.

Then, a chip stack 200 may be formed on a first surface 101 of the carrier substrate 100. The chip stack 200 may include a plurality of semiconductor chips 210, 220, 230 and 240 stacked in a direction perpendicular to the first surface 101 of the carrier substrate 100.

FIG. 1A illustrates that two chip stacks 200 are arranged in a first direction parallel to the first surface 101 of the carrier substrate 100. However, the present embodiments are not limited thereto, but one or more chip stacks 200 may be arranged in various directions. FIG. 1A illustrates that one chip stack 200 includes four semiconductor chips 210, 220, 230 and 240. However, the present embodiments are not limited thereto, but the number of semiconductor chips included in one chip stack 200 may be changed to various values. Hereafter, for convenience of description, the four semiconductor chips 210, 220, 230 and 240 will be referred to as a first semiconductor chip 210, a second semiconductor chip 220, a third semiconductor chip 230 and a fourth semiconductor chip 240, respectively, according to distances from the carrier substrate 100. Furthermore, for convenience of description, a position relatively close to the carrier substrate 100 in a vertical direction will be referred to as a lower/bottom position, and a position relatively far from the carrier substrate 100 will be referred to as an upper/top position. For example, the first semiconductor chip 210 may be referred to as being located at the lowermost part of the chip stack 200, and the fourth semiconductor chip 240 may be referred to as being located at the uppermost part of the chip stack 200. However, the fabricated package may be turned upside down. In this case, the bottom/lower portion and the top/upper portion of the package may be exchanged.

The first to fourth semiconductor chips 210, 220, 230 and 240 may include first to fourth active surfaces 216, 226, 236 and 246 and first to fourth inactive surfaces 217, 227, 237 and 247, respectively. The first to fourth active surfaces 216, 226, 236 and 246 do not face the first surface 101 of the carrier substrate 100, and the first to fourth inactive surfaces 217, 227, 237 and 247 are located on the opposite side of the first to fourth active surfaces 216, 226, 236 and 246 to face the first surface 101 of the carrier substrate 100. The first to fourth semiconductor chips 210, 220, 230 and 240 may include first to fourth chip pads 212, 222, 232 and 242 disposed on the first to fourth active surfaces 216, 226, 236 and 246, respectively. The first to fourth chip pads 212, 222, 232 and 242 may be bonding pads for wiring bonding.

The first to fourth semiconductor chips 210, 220, 230 and 240 may be stacked in such a manner that the first to fourth chip pads 212, 222, 232 and 242 are all exposed, when seen from the top. For example, a portion of the first active surface 216 of the first semiconductor chip 210 might not be covered by the second to fourth semiconductor chips 220, 230 and 240 disposed over the first active surface 216, but exposed. The first chip pad 212 may be disposed in such a portion of the first active surface 216. Similarly, a portion of the second active surface 226 of the second semiconductor chip 220 might not be covered by the third and fourth semiconductor chips 230 and 240 disposed over the second active surface 226, but exposed. The second chip pad 222 may be disposed in such a portion of the second active surface 226. Similarly, a portion of the third active surface 236 of the third semiconductor chip 230 might not be covered by the fourth semiconductor chip 240 disposed over the third active surface 236, but exposed. The third chip pad 232 may be disposed in such a portion of the third active surface 236. On the other hand, since the fourth semiconductor chip 240 is positioned at the uppermost part of the chip stack 200 such that the entire fourth active surface 246 is exposed, there may be no limitation in the formation position of the fourth chip pad 242. Hereafter, the exposed portions of the first to third active surfaces 216, 226 and 236 will be referred to as exposed parts of the first to third active surfaces 216, 226 and 236, and represented by reference numerals 216A, 226A and 236A, respectively.

As an example of such a stacked structure, the first to fourth semiconductor chips 210, 220, 230 and 240 may be stacked in such a manner that a cross-section of the chip stack 200 has an arrow shape facing one side, i.e. the right-hand direction, as illustrated in FIG. 1A. For example, the chip stack 200 may include the first and second semiconductor chips 210 and 220 which are stacked with a constant offset to one side, for example, the right side in the first direction, and the third and fourth semiconductor chips 230 and 240 which are disposed over the first and second semiconductor chips 210 and 220 and stacked with a constant offset to the other side, for example, the left side in the first direction. As the first and second semiconductor chips 210 and 220 are stacked with the offset to the right side, the left end portions of the first and second active surfaces 216 and 226 may correspond to the exposed parts 216A and 226A of the first and second active surfaces 216 and 226, and the first and second chip pads 212 and 222 may be disposed in the exposed parts 216A and 226A. That is, the first and second semiconductor chips 210 and 220 may be edge pad-type semiconductor chips having the first and second chip pads 212 and 222 disposed at the other side edges, for example, the left edges thereof. On the other hand, as the third and fourth semiconductor chips 230 and 240 are stacked with the offset to the left side, the right end portion of the third active surface 236 may correspond to the exposed part 236A of the third active surface 236, and the third chip pad 232 may be disposed in the exposed part 236A. That is, the third semiconductor chip 230 may be an edge pad-type semiconductor chip having the third chip pad 232 disposed at the one side edges, for example, the right edge thereof. Since the fourth semiconductor chip 240 has the fourth active surface 246 of which the entire portion is exposed, the fourth semiconductor chip 240 does not need to be an edge pad-type semiconductor chip. For example, the fourth semiconductor chip 240 may be a center pad-type semiconductor chip. However, in this embodiment, the fourth semiconductor chip 240 is an edge pad-type semiconductor chip. FIG. 1A illustrates that the fourth chip pad 242 is disposed at the right edge of the fourth active surface 246 in the first direction.

Since the cross-sectional view of FIG. 1A is based on the first direction, FIG. 1A illustrates that the first to fourth chip pads 212, 222, 232 and 242 are formed in the first to fourth semiconductor chips 210, 220, 230 and 240, respectively. In other words, FIG. 1A illustrates that one chip pad is formed in each of the semiconductor chips. However, referring to the plan view of FIG. 1B, a plurality of first chip pads 212 may be arranged in the exposed part 216A of the first active surface 216 of the first semiconductor chip 210 in a second direction to be spaced apart from each other, the second direction being parallel to the first surface 101 of the carrier substrate 100 and substantially perpendicular to the first direction. FIG. 1B illustrates that the eight first chip pads 212 are formed in a line, but the number and arrangement of the first chip pads 212 may be modified in various manners. Similarly, a plurality of second chip pads 222 may be arranged in the exposed part 226A of the second active surface 226 in the second direction to be spaced apart from each other, and a plurality of third chip pads 232 may be arranged in the exposed part 236A of the third active surface 236 in the second direction to be spaced apart from each other. At the right edge of the fourth active surface 246 in the first direction, a plurality of fourth chip pads 242 may be arranged in the second direction to be spaced apart from each other.

FIG. 1A illustrates that the two first and second semiconductor chips 210 and 220 are stacked with the offset to the right, and the two third and fourth semiconductor chips 230 and 240 are stacked with the offset to the left over the first and second semiconductor chips 210 and 220. However, the offset direction and the number of the semiconductor chips stacked with the offset may be modified in various manners. In any cases, as long as the plurality of semiconductor chips are stacked in such a manner that the chip pads of any one semiconductor chip among the plurality of semiconductor chips are not covered by the semiconductor chip(s) disposed thereon, the stacked structure of the semiconductor chips may be modified in various manners.

The first to fourth semiconductor chips 210, 220, 230 and 240 may be the same chips. Furthermore, the first to fourth semiconductor chips 210, 220, 230 and 240 may be memory chips. For example, the first to fourth semiconductor chips 210, 220, 230 and 240 may be mobile dynamic random access memories (DRAMs). However, the present embodiments are not limited thereto, but the first to fourth semiconductor chips 210, 220, 230 and 240 may be nonvolatile memory chips such as a phase-change RAM (PRAM) and a magneto-resistive RAM (MRAM) or volatile memory chips such as a DRAM and a static RAM (SRAM). When the first to fourth semiconductor chips 210, 220, 230 and 240 are the same type of chips, for example, the same type of mobile DRAMs, the first to fourth chip pads 212, 222, 232 and 242 may be located at the same positions. However, the first and second semiconductor chips 210 and 220 may be stacked in such a manner that the first and second chip pads 212 and 222 are located at the left edge, whereas the third and fourth semiconductor chips 230 and 240 may be stacked in a different direction from the first and second semiconductor chips 210 and 220 such that the third and fourth chip pads 232 and 242 are located at the right edge.

Each of the first to fourth inactive surfaces 217, 227, 237 and 247 of the first to fourth semiconductor chips 210, 220, 230 and 240 may have an adhesive layer 205 formed thereon. Through the adhesive layer 205, the first to fourth semiconductor chips 210, 220, 230 and 240 may be attached to the first surface 101 of the carrier substrate 100 and the first to third active surfaces 216, 226 and 236 of the first to third semiconductor chips 210, 220 and 230, respectively. The adhesive layer 205 may include a dielectric adhesive material such as a die attach film (DAF).

Figure 2A:
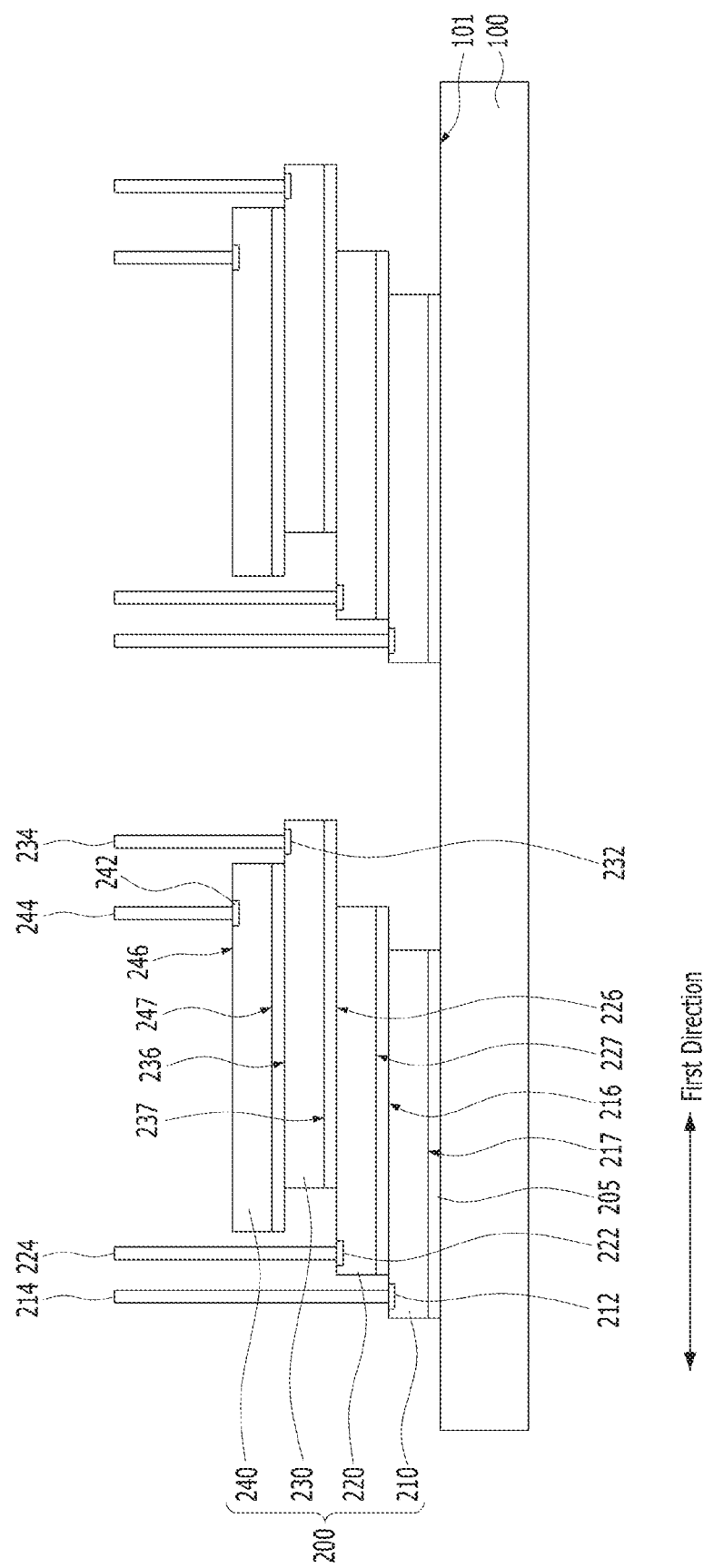
Figure 2B:
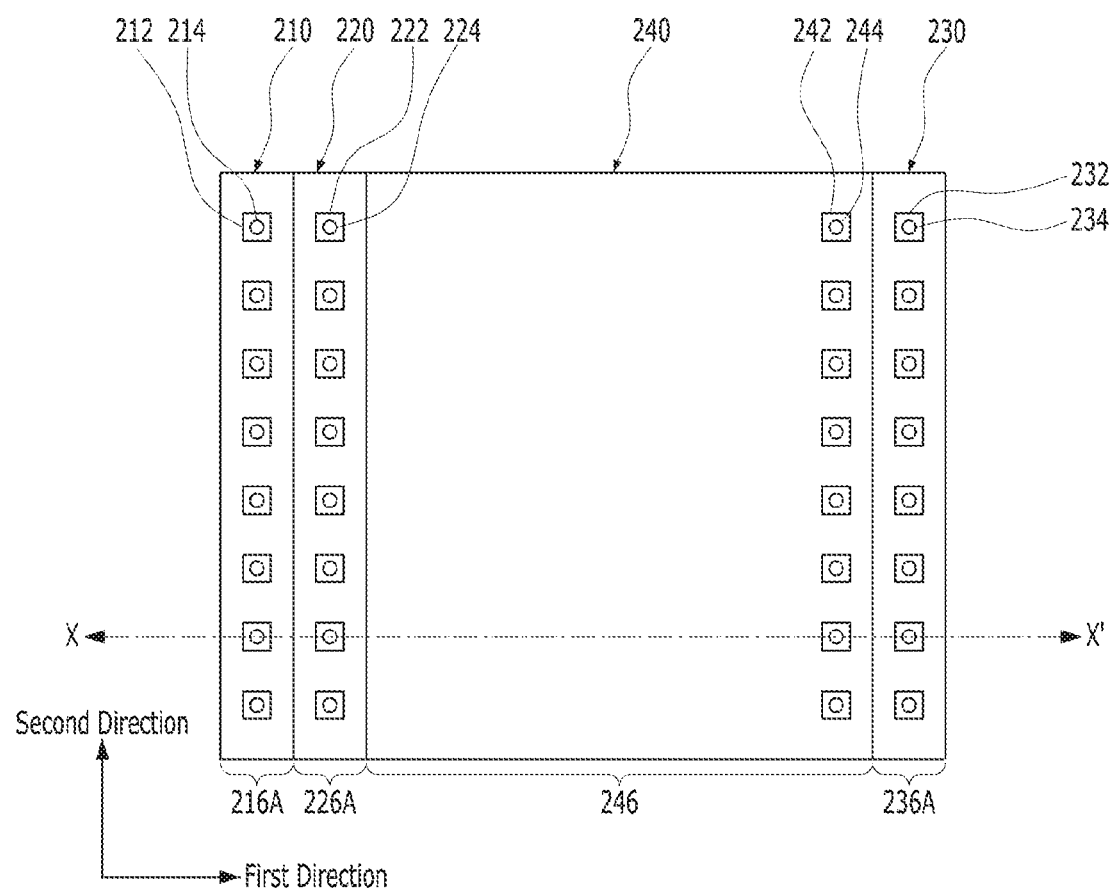

Referring to FIGS. 2A and 2B, first to fourth vertical wires 214, 224, 234 and 244 may be formed to be extended in the vertical direction, while connected to the first to fourth chip pads 212, 222, 232 and 242, respectively.

A process of forming the first vertical wire 214 will be briefly described as follows. First, one end (i.e., first end) of the wire may be bonded to the first chip pad 212 through a wire bonding machine (not illustrated). The wire may include metals such as gold, silver, copper and platinum or alloys thereof, which can be welded to the first chip pad 212 by ultrasonic energy and/or heat. Then, the other end (i.e., second end) of the wire may be pulled in a direction away from the carrier substrate 100, for example, from bottom to top, through the wire bonding machine. Then, when the other end of the wire is extended to a desired position, the other end of the wire may be cut. In this way, the first vertical wire 214 may be formed, which has a first end, for example, a lower end bonded to the first chip pad 212 and a second end, for example, an upper end located at a predetermined distance from the first surface 101 of the carrier substrate 100. The predetermined distance may have a larger value than a distance from the first surface 101 of the carrier substrate 100 to the top surface of the chip stack 200. The word "predetermined" as used herein with respect to a parameter, such as a predetermined distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In a similar manner, the second to fourth vertical wires 224, 234 and 244 may be formed. The first ends of the second to fourth vertical wires 224, 234 and 244, for example, the lower ends, may be bonded to the second to fourth chip pads 222, 232 and 242, respectively. The second ends of the second to fourth vertical wires 224, 234 and 244, for example, the upper ends, may be located at the predetermined distance greater than the distance from the first surface 101 of the carrier substrate 100 to the top surface of the chip stack 200.

FIG. 2A illustrates that the upper ends of the first to fourth vertical wires 214, 224, 234 and 244 are located substantially at the same level in the vertical direction. However, the present embodiments are not limited thereto, but the upper ends of the first to fourth vertical wires 214, 224, 234 and 244 may be located at different levels in the vertical direction, as long as the distances from the first surface 101 of the carrier substrate 100 to the upper ends of the first to fourth vertical wires 214, 224, 234 and 244 are larger than the distance from the first surface 101 of the carrier substrate 100 to the top surface of the chip stack 200. In the horizontal direction, the first to fourth vertical wires 214, 224, 234 and 244 may be arranged at different positions to be spaced apart from each other.

Figure 3B:
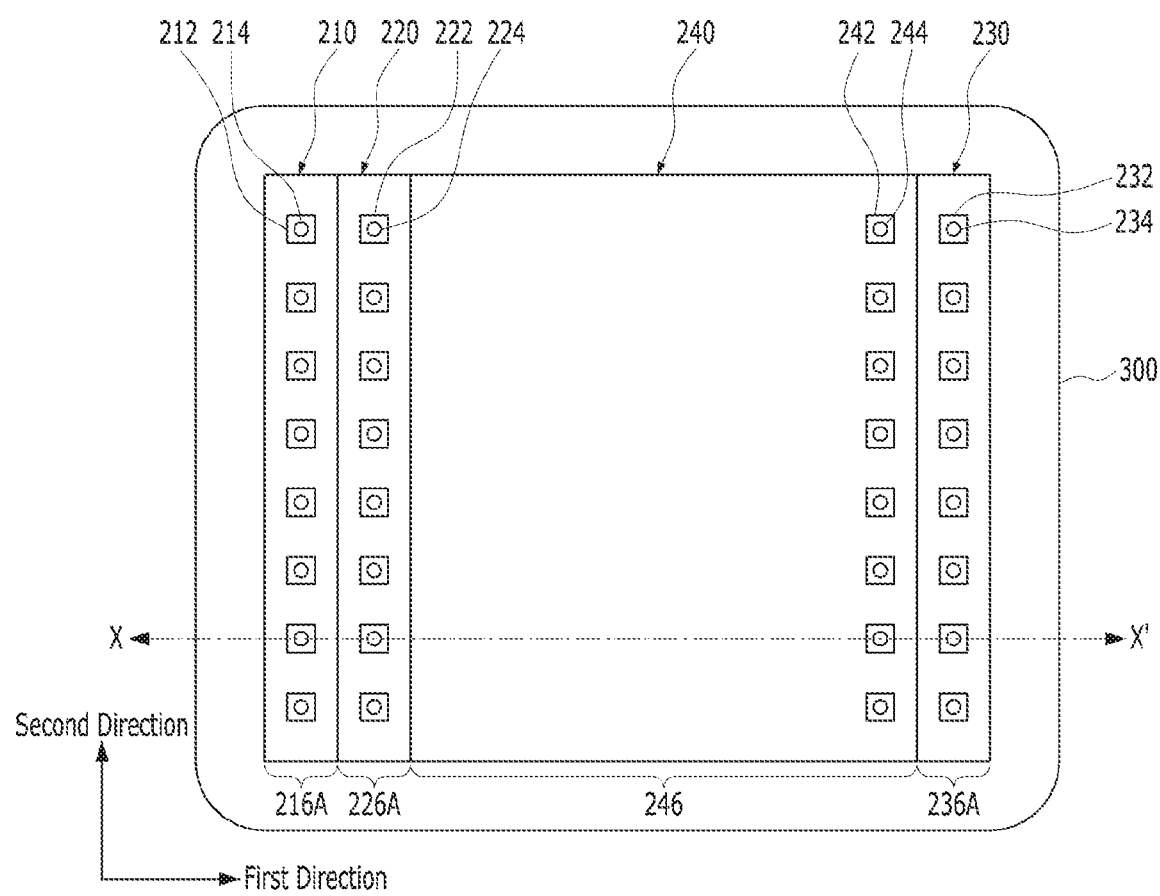

Referring to FIGS. 3A and 3B, a coating layer 300 may be formed on the carrier substrate 100 on which the chip stack 200 and the first to fourth vertical wires 214, 224, 234 and 244 are formed.

The coating layer 300 may be formed to surround the lower portions of the vertical wires having relatively large lengths among the first to fourth vertical wires 214, 224, 234 and 244, i.e. the vertical wires connected to the semiconductor chips relatively closer to the carrier substrate 100. For example, the coating layer 300 may be formed to surround the lower portions of the first and second vertical wires 214 and 224 connected to the first and second semiconductor chips 210 and 220. The lower portion of each of the vertical wires may indicate a portion of the vertical wire, which has a lesser length than the total length of the vertical wire, from the lower end attached to the semiconductor chip. The coating layer 300 is formed to prevent sweeping of the vertical wire. This will be described below with reference to FIG. 7.

Figure 7:
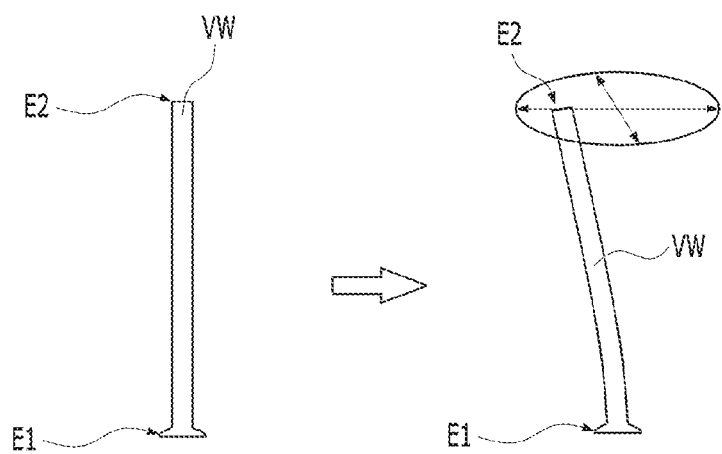
FIG. 7 is a diagram illustrating sweeping of a vertical wire.

FIG. 7 illustrates sweeping of a vertical wire.

Referring to FIG. 7, a vertical wire VW may have one end E1 attached to a chip pad and the other end E2 located on the opposite side thereof.

The left side of an arrow shows a state immediately after the vertical wire VW is formed. In other words, the left side of the arrow shows a state immediately after wire cutting in a wire bonding process using a wire bonding machine. Such a vertical wire VW may maintain a state in which the vertical wire VW is erected in the vertical direction, as long as no external force is applied.

The right side of the arrow shows a state after an external force, for example, pressure is applied to the vertical wire VW by a flow of molding material during a molding process. When the pressure is applied as described above, the one end E1 of the vertical wire VW is not moved because the one end E1 is attached and fixed to the chip pad. However, since the other end E2 of the vertical wire VW is not fixed but moved in the direction that the pressure is applied, sweeping may occur, that is, the vertical wire VW may be bent. As a result of the sweeping, the other end E2 of the vertical wire VW may be displaced to a random position in a circle illustrated in FIG. 7, for example. The displacement of the other end E2 of the vertical wire VW may be changed by a vortex of the molding material, which is caused by the injection direction and pressure of the molding material and the surrounding structure. The larger the length of the vertical wire VW, the more severe the sweeping. In case of the sweeping of the vertical wire VW, various problems may occur. For example, a short circuit may occur between adjacent vertical wires, and the vertical wire VW and the chip pad may be disconnected from each other. Furthermore, since the position of the other end E2 of the vertical wire VW is changed, a component (not illustrated) to be connected to the other end E2 of the vertical wire VW, for example, a redistribution layer, may be misaligned from the other end E2 of the vertical wire VW. In this case, a connection defect may occur between the vertical wire VW and the redistribution layer.

Referring back to FIGS. 3A and 3B, the coating layer 300 may be formed to surround the connection portions between the lower ends of the first and second vertical wires 214 and 224 and the first and second chip pads 212 and 222, while surrounding the lower portions of the first and second vertical wires 214 and 224. In this case, since the lower portions of the first and second vertical wires 214 and 224 are fixed by the coating layer 300, the first and second vertical wires 214 and 224 might not be moved during the molding process (see FIG. 4) which will be described later. Therefore, since only the upper portions of the first and second vertical wires 214 and 224 can be moved during the molding process, the lengths of the movable portions of the first and second vertical wires 214 and 224 may be reduced, which makes it possible to decrease the degree of the sweeping.

Under the supposition that the coating layer 300 surrounds the lower portions of the first and second vertical wires 214 and 224 and the connection portions between the first and second vertical wires 214 and 224 and the first and second chip pads 212 and 222, the shape of the coating layer 300 may be modified in various manners. For example, as illustrated in FIG. 3A, the coating layer 300 may have a shape to surround the chip stack 200, while having a first height H1 from the first surface 101 of the carrier substrate 100. As illustrated in FIG. 3A, the first height H1 may be substantially equal to the height of the top surface of the third semiconductor chip 230. Thus, the coating layer 300 may cover the sidewalls of the first to third semiconductor chips 210, 220 and 230 and the exposed parts 216A and 226A of the first and second active surfaces 216 and 226 of the first and second semiconductor chips 210 and 220, while surrounding the lower portions of the first and second vertical wires 214 and 224. Furthermore, the coating layer 300 may be formed to fill the space under the third semiconductor chip 230 protruding to the right further than the first and second semiconductor chips 210 and 220. However, the present embodiments are not limited thereto, but the first height H1 may be changed to various values in a range from the height of the top surface of the first semiconductor chip 210 to the height of the top surface of the chip stack 200. The first height H1 may be decided in consideration of the above-described sweeping of the vertical wire. That is, when the sweeping degree of the vertical wire is high due to an increase in pressure by a flow of molding material, the first height H1 may be relatively increased. On the other hand, when the sweeping degree of the vertical wire is low due to a decrease in pressure by the flow of molding material, the first height H1 may be relatively decreased. When the coating layer 300 is uniformly applied to the entire side surfaces of the chip stack 200 as illustrated in FIG. 3A, the formation position of the coating layer 300 does not need to be precisely controlled, compared to when the coating layer 300 is applied only to one side surface, for example, the left side surface. Thus, the fabrication process can be facilitated. For example, the coating layer in the application step may be liquid discharged through a nozzle. The liquid will run down and spread around, even though there is a difference depending on viscosity. Therefore, in order to apply the coating layer with such a property to only one side surface, the formation position of the coating layer needs to be precisely controlled in consideration of the viscosity of the coating liquid. Thus, in an embodiment, the coating layer 300 may be applied to the entire side surfaces of the chip stack 200.

The coating layer 300 may be formed by injecting a coating material using a dispenser or the like and curing the coating material. FIG. 3A illustrates only the nozzle of the dispenser. The coating material may include thermosetting liquid resin, for example, epoxy resin, silicon resin or a combination thereof. Since the coating material has lower viscosity than the molding material to be described below and is injected by the dispenser, the coating material may be free from sweeping of the vertical wire. In order to form the coating layer 300 as illustrated in FIG. 3A, the nozzle for injecting the coating material may be disposed at a height equal to or more than the first height H1 at the first and second vertical wires 214 and 224, for example, on the left side in the first direction, and inclined toward the first and second vertical wires 214 and 224 to spray the coating material. Since the coating material is a liquid material with relatively low viscosity, the coating material may flow up to the opposite side of the nozzle even though the nozzle is located at the first and second vertical wires 214 and 224, thereby surrounding the sidewalls of the chip stack 200 in all directions.

In order to form the coating layer 300 to surround each of the chip stacks 200 at the first height H1 as illustrated in FIG. 3A, the viscosity of the coating material may need to be controlled. The viscosity of the coating material may be decided according to the content of a filler contained in the coating material. However, when the viscosity of the coating material is excessively lowered, it may make it difficult for the coating layer 300 to surround each of the chip stacks 200. Furthermore, the coating layer 300 may cover the entire first surface 101 of the carrier substrate 100 while surrounding all the chip stacks 200. In this case, the volume of the coating layer 300 may be increased. When the volume of the coating layer 300 having a low filler content in the package is increased, a problem may occur in the reliability of the package. Therefore, the viscosity of the coating material may be adjusted so that the coating layer 300 has a desired shape.

Figure 4:
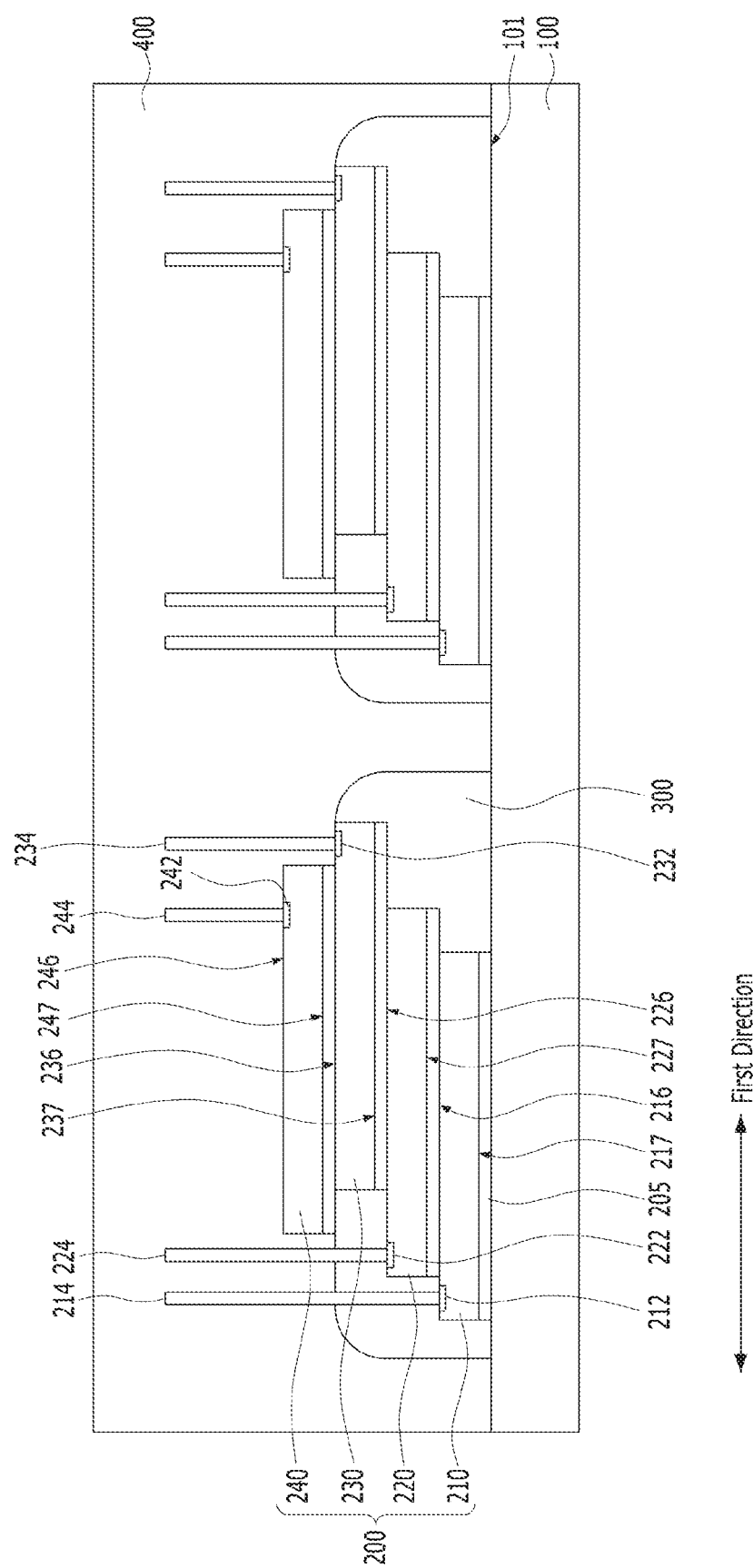

Referring to FIG. 4, a molding layer 400 may be formed on the carrier substrate 100 on which the chip stack 200, the first to fourth vertical wires 214, 224, 234 and 244 and the coating layer 300 are formed.

The molding layer 400 may be formed to have such a thickness that sufficiently covers the chip stack 200, the first to fourth vertical wires 214, 224, 234 and 244 and the coating layer 300.

The molding layer 400 may be formed through a molding process of filling an empty space of a molding die (not illustrated) with a molding material and curing the molding material. The molding material may include thermosetting liquid resin, for example, epoxy mold compound (EMC), and have higher viscosity and/or higher filler content than the above-described coating material. When the molding layer 400 is formed, pressure by a flow of the molding material may be applied to the first to fourth vertical wires 214, 224, 234 and 244. However, since the third and fourth vertical wires 234 and 244 have a relatively small length, bending may be prevented and/or reduced. Furthermore, since the lower portions of the first and second vertical wires 214 and 224 are fixed by the coating layer 300 such that the first and second vertical wires 214 and 224 seem to have a relatively small length, bending may be prevented and/or reduced. When bending is reduced, displacements of the upper ends of the first to fourth vertical wires 214, 224, 234 and 244 are reduced. Thus, a contact error from the redistribution layer (see reference numeral 500 of FIG. 6) to be described later may be decreased to reduce a defective contact.

Figure 5:
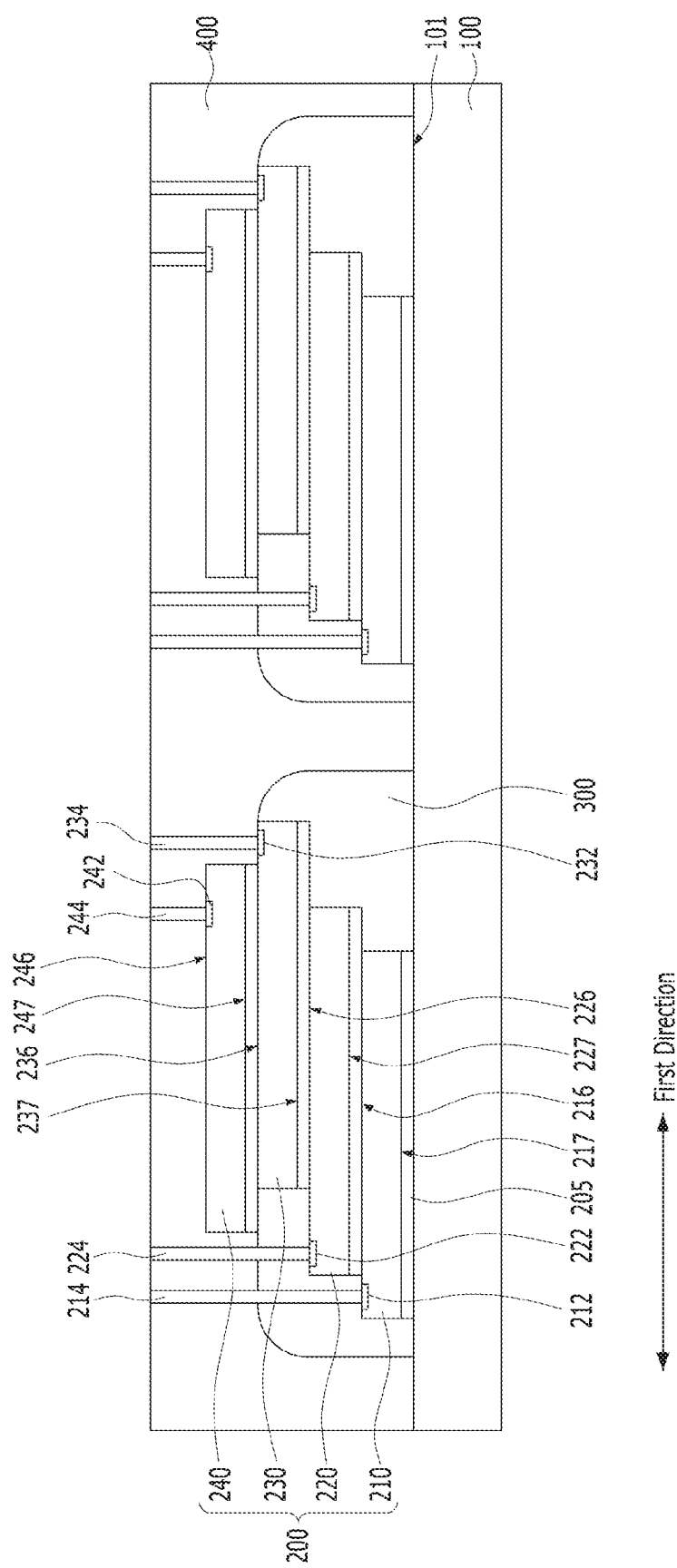

Referring to FIG. 5, a grinding process may be performed on the molding layer 400. The grinding process may include a mechanical polishing or chemical polishing process.

Through the grinding process, the molding layer 400 may have a flat surface 401 (see FIG. 6) located at a predetermined height from the first surface 101 of the carrier substrate 100. The height of the flat surface 401 may be greater than the height of the top surface of the chip stack 200. Furthermore, the upper ends of the first to fourth vertical wires 214, 224, 234 and 244 may be exposed through the flat surface 401, while located at the same height as the flat surface 401 of the molding layer 400. For example, the first to fourth vertical wires 214, 224, 234 and 244 may be surrounded by the molding layer 400 with the second ends of the first to fourth vertical wires 214, 224, 234 and 244 being exposed through the one surface of the molding layer 400. As such, in some embodiments, the second ends of the first to fourth vertical wires 214, 224, 234 and 244 as well as the one surface of the molding layer 400 may form the flat surface 401.

Figure 6:
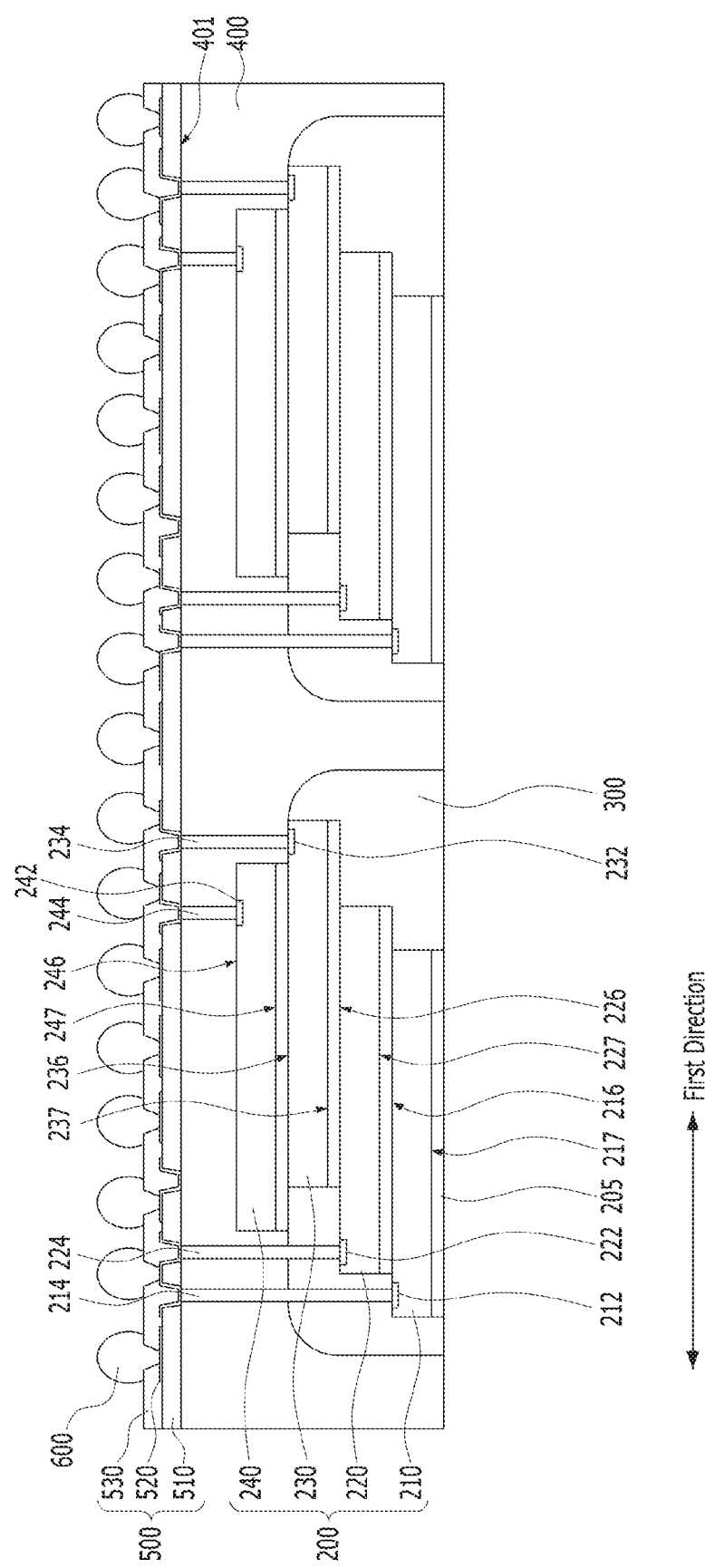

Referring to FIG. 6, the redistribution layer 500 may be formed on the flat surface 401 of the molding layer 400.

The formation process of the redistribution layer 500 will be described below as follows. First, a first redistribution dielectric layer 510 may be formed on the flat surface 401 of the molding layer 400. The first redistribution dielectric layer 510 may be patterned to have openings through which the first to fourth vertical wires 214, 224, 234 and 244 are exposed. Then, a redistribution conductive layer 520 may be formed on the first redistribution dielectric layer 510. The redistribution conductive layer 520 may fill the openings of the first redistribution dielectric layer 510 to be electrically connected to the upper ends of the first to fourth vertical wires 214, 224, 234 and 244, and be patterned in various shapes. Then, a second redistribution dielectric layer 530 may be formed on the first redistribution dielectric layer 510 and the redistribution conductive layer 520. The second redistribution dielectric layer 530 may be patterned to have openings through which portions of the redistribution conductive layer 520 are exposed.

Then, external connection terminals 600 may be formed on the redistribution layer 500 to be electrically connected to the redistribution conductive layer 520 through the openings of the second redistribution dielectric layer 530. In the present embodiments, solder balls are used as the external connection terminals 600. However, the present embodiments are not limited thereto, but various types of electrical connectors may be used.

Then, the carrier substrate 100 may be removed.

The semiconductor package in accordance with the present embodiments may be fabricated through the above-described process.

The semiconductor package in accordance with the present embodiments may include the chip stack 200, the first to fourth vertical wires 214, 224, 234 and 244, the coating layer 300 and the molding layer 400. The chip stack 200 may include the first to fourth semiconductor chips 210, 220, 230 and 240 having the first to fourth chip pads 212, 222, 232 and 242 formed on the first to fourth active surfaces 216, 226, 236 and 246, respectively, and stacked in the vertical direction such that the first to fourth chip pads 212, 222, 232 and 242 are exposed. The first to fourth vertical wires 214, 224, 234 and 244 may be extended in the vertical direction, while having the lower ends connected to the first to fourth chip pads 212, 222, 232 and 242, respectively. The coating layer 300 may surround the lower portions of the vertical wires having relatively large lengths among the first to fourth vertical wires 214, 224, 234 and 244, for example, the first and second vertical wires 214 and 224, and simultaneously surround the connection portions between the lower ends of the first and second vertical wires 214 and 224 and the first and second chip pads 212 and 222. The molding layer 400 may cover the chip stack 200, the coating layer 300 and the first to fourth vertical wires 214, 224, 234 and 244.

The semiconductor package in accordance with the present embodiments may further include the redistribution layer 500 and the external connection terminals 600 which are formed on the flat surface 401 of the molding layer 400. Since the redistribution layer 500 can be formed in a region defined by the molding layer 400, the semiconductor package in accordance with the present embodiments may be a fan-out semiconductor package.

Since the components of the semiconductor package have been already described during the process of describing the fabrication method, the detailed descriptions thereof will be omitted herein.

The semiconductor package and the method for fabricating the same, which have been described so far, may have the following effects.

First, although the lengths of the vertical wires connected to the respective stacked semiconductor chips are changed to various values, the coating layer may be used to reduce the sweeping of the vertical wires having relatively large lengths. Thus, it may be possible to prevent a defective contact with the redistribution layer due to the sweeping of the vertical wires.

Figure 8:
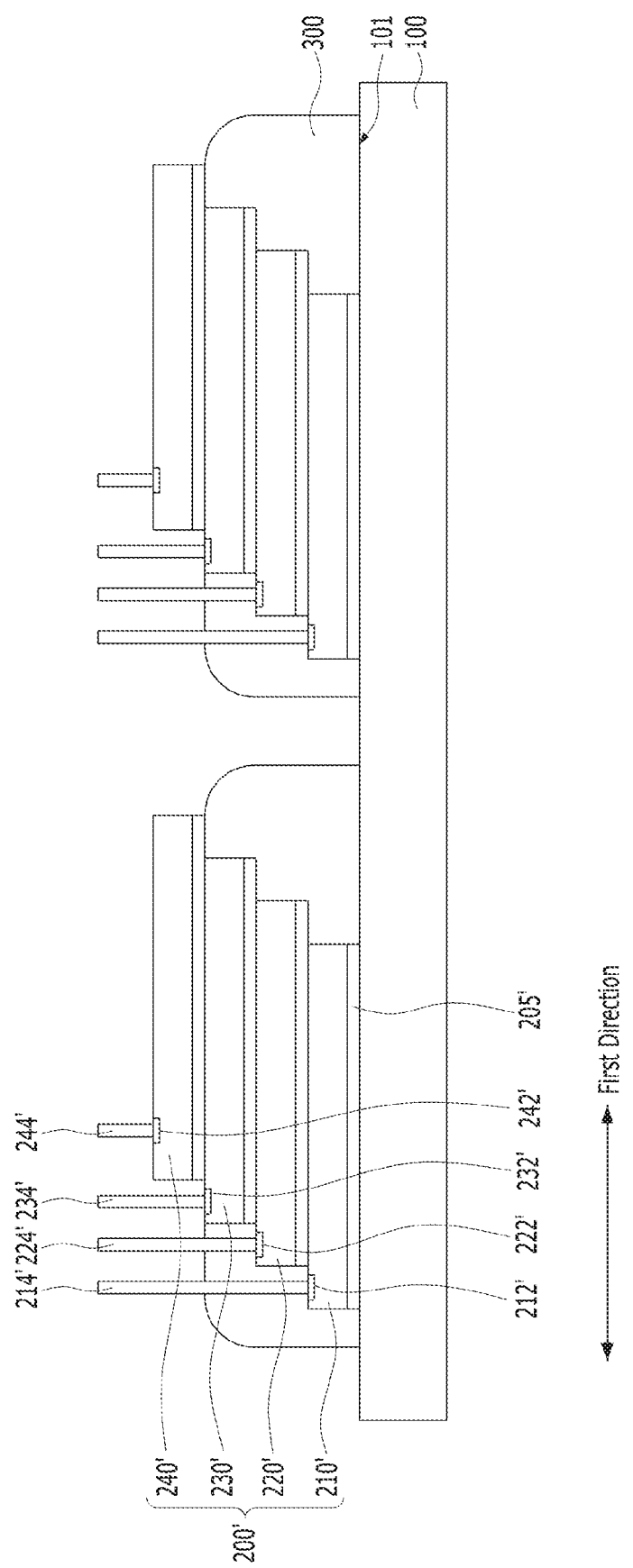
FIG. 8 is a cross-sectional view illustrating a semiconductor package in accordance with an embodiment.

FIG. 8 is a cross-sectional view illustrating a semiconductor package in accordance with an embodiment, showing another example of the stacked structure of the chip stack. The following descriptions will be focused on differences from the above-described embodiment.

Referring to FIG. 8, a chip stack 200' may include first to fourth semiconductor chips 210', 220', 230' and 240' stacked over the first surface 101 of the carrier substrate 100 in the vertical direction.

The first to fourth semiconductor chips 210', 220', 230' and 240' may be stacked with an offset in one direction, for example, the right-hand direction. That is, unlike the above-described embodiment, the chip stack 200' may have a stair shape.

In this case, first to fourth chip pads 212', 222', 232' and 242' may be disposed at left ends of the first to fourth semiconductor chips 210', 220', 230' and 240', respectively, and exposed.

Lower ends of first to fourth vertical wires 214', 224', 234' and 244' may be connected to the exposed first to fourth chip pads 212', 222', 232' and 242', respectively.

In the present embodiments, although the shape of the chip stack is changed, the advantages of the above-described embodiments can be secured as long as the semiconductor chips are stacked in the vertical direction such that the chip pads are exposed.

Figure 9A:
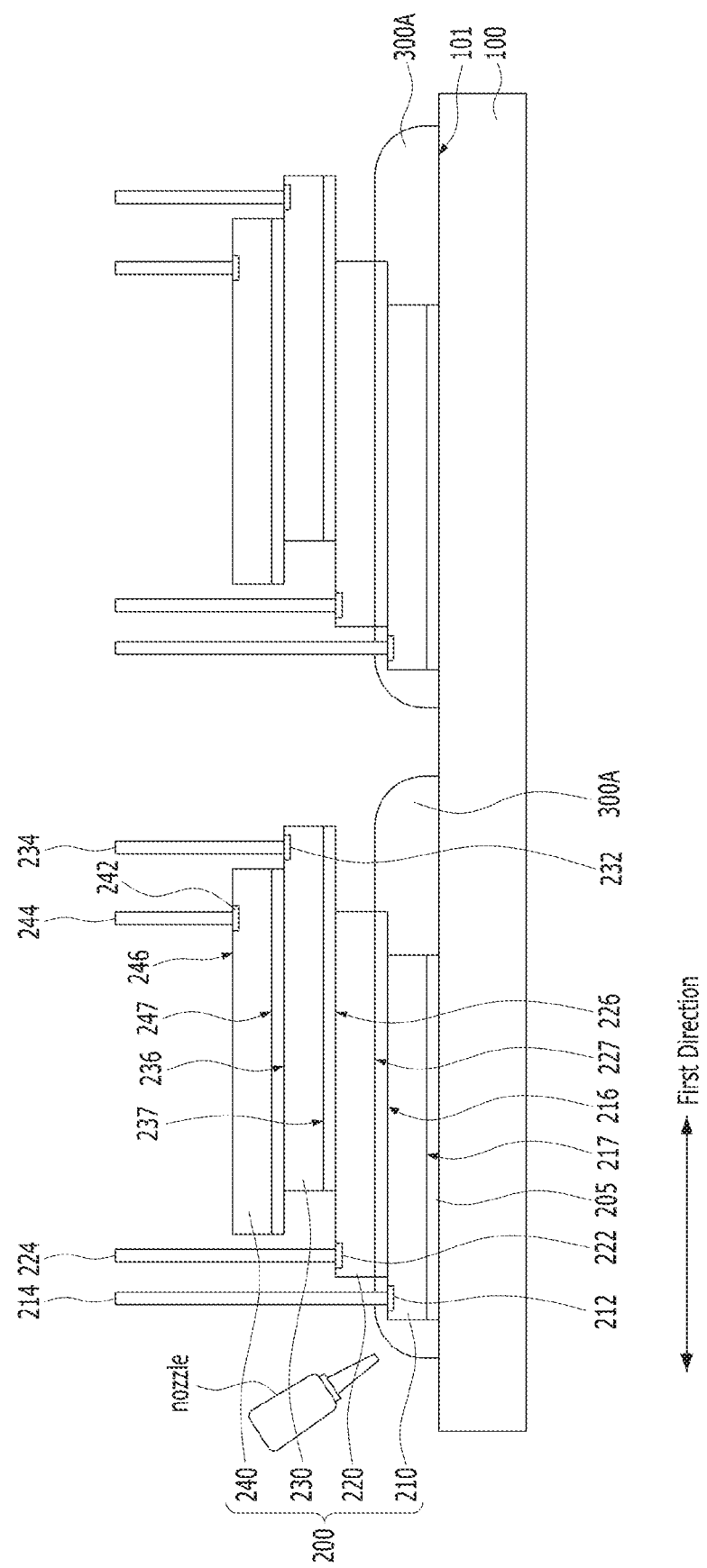
FIGS. 9A and 9B are cross-sectional views for describing a method for fabricating a semiconductor package in accordance with an embodiment.
Figure 9B:
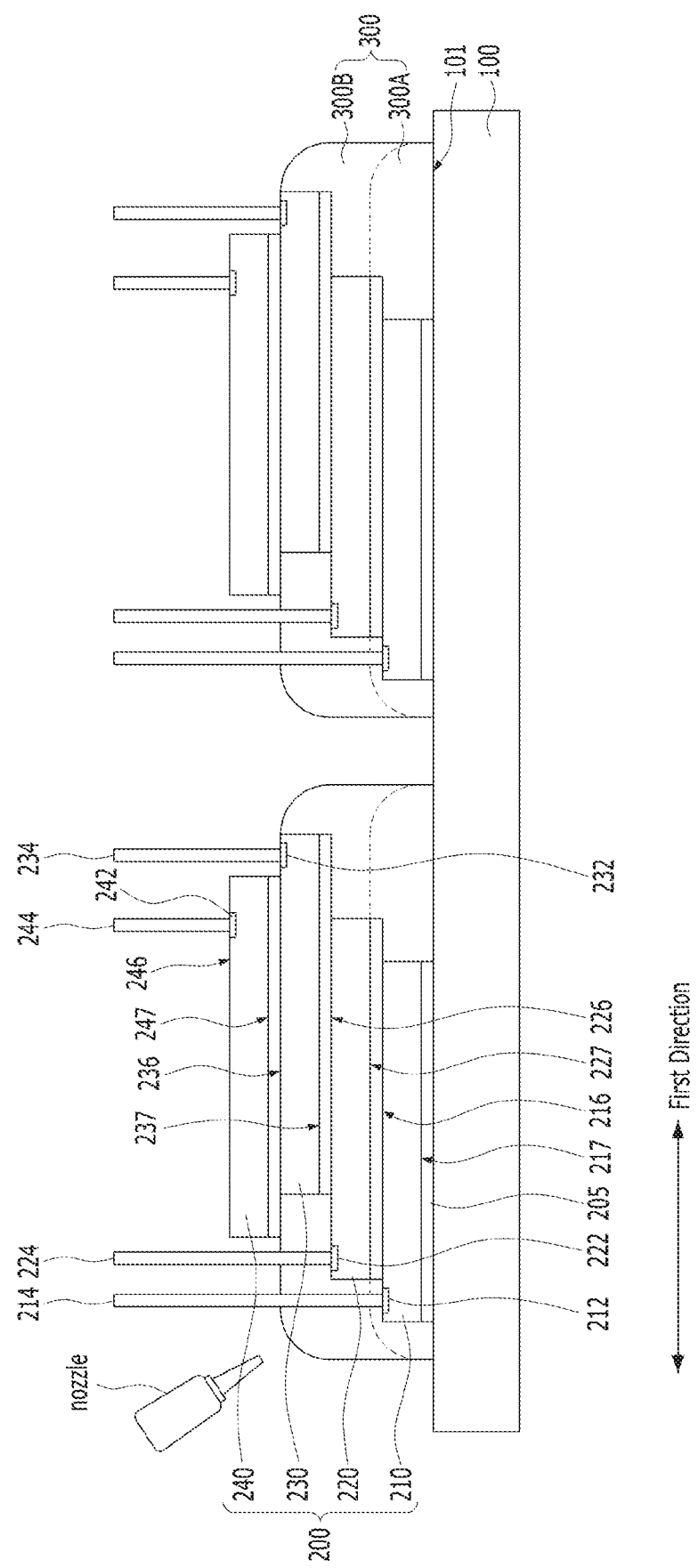

FIGS. 9A and 9B are cross-sectional views for describing a method for fabricating a semiconductor package in accordance with another embodiment, showing another example of the process of forming the coating layer. The following descriptions will be focused on differences from the above-described embodiments.

Referring to FIG. 9A, a first coating layer 300A may be formed on the carrier substrate 100 on which the chip stack 200 and the first to fourth vertical wires 214, 224, 234 and 244 are formed, after the process of FIGS. 2A and 2B is performed.

The first coating layer 300A may be formed to a height lesser than a target height.

Referring to FIG. 9B, a second coating layer 300B may be formed on the first coating layer 300A. The sum of the heights of the first and second coating layers 300A and 300B may correspond to the target height. In other words, the first and second coating layers 300A and 300B may form substantially the same coating layer 300 as the coating layer 300 of FIGS. 3A and 3B.

The forming of the first and second coating layers 300A and 300B may be performed by repeating the process of injecting and curing a coating material twice.

As described above, the coating material has relatively low viscosity. Thus, when the target height is large, it may be difficult to form the coating layer with a desired height through one process of injecting and curing the coating material. Therefore, when the process of injecting and curing the coating material is performed twice as in the present embodiment, it may be easy to secure the coating layer at a desired height. Furthermore, the process of injecting and curing the coating material may be performed three or more times.

In accordance with the present embodiments, it may be possible to provide a semiconductor package including stacked semiconductor chips, which can be suppress a defect in a fabrication process, and a method for fabricating the same.

Although various embodiments have been described for illustrative purposes, it will be apparent to those skilled in the art that various changes and modifications may be made without departing from the spirit and scope of the disclosure as defined in the following claims.

What is claimed is:

1. A semiconductor package comprising:
   a chip stack comprising first to $N^{th}$ semiconductor chips having first to $N^{th}$ chip pads, respectively, the first to $N^{th}$ chip pads formed in active surfaces of the first to $N^{th}$ semiconductor chips, respectively, and the first to $N^{th}$ semiconductor chips sequentially stacked in a vertical direction such that the first to $N^{th}$ chip pads are exposed, wherein N is a natural number equal to or more than 2;
   first to $N^{th}$ vertical wires having first ends connected to the first to $N^{th}$ chip pads, respectively, and extended in the vertical direction;
   a coating layer surrounding portions of the first to $k^{th}$ vertical wires, extended from the first ends, among the first to $N^{th}$ vertical wires, and connection portions between the first ends of the first to $k^{th}$ vertical wires and the first to $k^{th}$ chip pads, wherein k is a natural number equal to or more than 1 and equal to or less than (N−1); and
   a molding layer covering the chip stack, surrounding the vertical wires, and covering the coating layer.

2. The semiconductor package of claim 1, wherein the coating layer surrounds at least a part of sidewalls of the chip stack.

3. The semiconductor package of claim 1, wherein one surface of the coating layer is located at the same level as an inactive surface located on the opposite side of the active surface of the first semiconductor chip, and the other surface of the coating layer, located on the opposite side of the one surface, is located at a level between the active surface of the first semiconductor chip and the active surface of the $N^{th}$ semiconductor chip.

4. The semiconductor package of claim 1, wherein the coating layer has a lower filler content than the molding layer.

5. The semiconductor package of claim 1, wherein the second ends of the first to $N^{th}$ vertical wires, located on the opposite side of the first ends, are exposed through one surface of the molding layer.

6. The semiconductor package of claim 5, wherein the second ends of the first to $N^{th}$ vertical wires and the one surface of the molding layer form a flat surface.

7. The semiconductor package of claim 6, further comprising a redistribution layer formed on the flat surface, and electrically connected to the second ends of the first to $N^{th}$ vertical wires.

8. The semiconductor package of claim 7, wherein the redistribution layer comprises:
   a first redistribution dielectric layer covering the one surface of the molding layer and having openings through which the second ends of the first to $N^{th}$ vertical wires are exposed;
   a redistribution conductive layer formed on the first redistribution dielectric layer, and electrically connected to the second ends of the first to $N^{th}$ vertical wires through the openings; and
   a second redistribution dielectric layer covering the redistribution conductive layer and having openings through which portions of the redistribution conductive layer are exposed.

9. The semiconductor package of claim 8, further comprising an external connection terminal electrically connected to the redistribution conductive layer through each of the openings of the second redistribution dielectric layer.

10. The semiconductor package of claim 1, wherein the first to $N^{th}$ semiconductor chips comprise the first to $k^{th}$ semiconductor chips stacked with an offset to one side and the $(k+1)^{th}$ to $N^{th}$ semiconductor chips stacked with an offset to the other side corresponding to the opposite side of the one side, where k is a natural number equal to or more than 1 and equal to or less than N−1.

11. The semiconductor package of claim 10, wherein the first to $k^{th}$ chip pads of the first to $k^{th}$ semiconductor chips are disposed at the other side edges of the first to $k^{th}$ semiconductor chips, and the $(k+1)^{th}$ to $N^{th}$ semiconductor chip pads of the $(k+1)^{th}$ to $N^{th}$ semiconductor chips are disposed at the one side edges of the $(k+1)^{th}$ to $N^{th}$ semiconductor chips.

12. The semiconductor package of claim 1, wherein the first to $N^{th}$ semiconductor chips are stacked with an offset to one side.

13. The semiconductor package of claim 12, wherein the first to $N^{th}$ chip pads of the first to $N^{th}$ semiconductor chips are disposed at the other side edges of the first to $N^{th}$ semiconductor chips on the opposite side of the one side.

14. The semiconductor package of claim 1, wherein the first to $N^{th}$ semiconductor chips are realized by the same type of memory chip.

15. The semiconductor package of claim 1, wherein the chip stack comprises a first chip stack and a second chip stack which are spaced apart from each other,
  wherein the coating layer comprises a first coating layer surrounding sidewalls of the first chip stack and a second coating layer spaced apart from the first coating layer and surrounding sidewalls of the second chip stack.

16. A method for fabricating a semiconductor package, comprising:
  forming a chip stack which includes first to $N^{th}$ semiconductor chips having first to $N^{th}$ chip pads, respectively, the first to $N^{th}$ chip pads formed on active surfaces of the first to $N^{th}$ semiconductor chips, respectively, and the first to $N^{th}$ semiconductor chips sequentially stacked in a vertical direction such that the first to $N^{th}$ chip pads are exposed, wherein N is a natural number equal to or more than 2;
  forming first to $N^{th}$ vertical wires having first ends connected to the first to $N^{th}$ chip pads, respectively, and extended in the vertical direction;
  forming a coating layer which surrounds portions of the first to $k^{th}$ vertical wires, extended from the first ends, among the first to $N^{th}$ vertical wires, and connection portions between the first ends of the first to $k^{th}$ vertical wires and the first to $k^{th}$ chip pads, wherein k is a natural number equal to or more than 1 and equal to or less than (N−1); and
  forming a molding layer which covers the chip stack, surrounds the vertical wires, and covers the coating layer.

17. The method of claim 16, wherein the coating layer has a lower filler content than the molding layer.

18. The method of claim 16, wherein one surface of the coating layer is located at the same level as an inactive surface located on the opposite side of the active surface of the first semiconductor chip, and the other surface of the coating layer, located on the opposite side of the one surface, is located at a level between the active surface of the first semiconductor chip and the active surface of the $N^{th}$ semiconductor chip.

19. The method of claim 16, wherein the forming of the molding layer comprises performing grinding such that the molding layer has one surface formed at the same level as second ends of the first to $N^{th}$ vertical wires, located on the opposite side of the first ends.

20. The method of claim 19, further comprising forming a redistribution layer on the one surface of the molding layer to be electrically connected to the second ends of the first to $N^{th}$ vertical wires.

* * * * *